(12) United States Patent
Kim et al.

(10) Patent No.: US 7,795,719 B2
(45) Date of Patent: Sep. 14, 2010

(54) ELECTRO COMPONENT PACKAGE

(75) Inventors: Heung-Kyu Kim, Cheongju-si (KR); Young-Hwan Shin, Daejeon (KR); Jong-Jin Lee, Daejeon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/357,643

(22) Filed: Jan. 22, 2009

(65) Prior Publication Data

US 2010/0090351 A1 Apr. 15, 2010

(30) Foreign Application Priority Data

Oct. 9, 2008 (KR) .................. 10-2008-0099316

(51) Int. Cl.
*H01L 23/02* (2006.01)
(52) U.S. Cl. ............ 257/686; 257/724
(58) Field of Classification Search ............ 257/777, 257/786, 784, 723, 724, 686
See application file for complete search history.

(56) References Cited

U.S. PATENT DOCUMENTS

| | | | |
|---|---|---|---|
| 6,611,051 B2* | 8/2003 | Akiyama et al. ............ 257/685 |
| 6,621,155 B1* | 9/2003 | Perino et al. ............ 257/686 |
| 6,762,937 B2* | 7/2004 | Kimoto et al. ............ 361/699 |
| 6,919,644 B2* | 7/2005 | Uchida ............ 257/784 |
| 6,998,702 B1* | 2/2006 | Zwenger et al. ............ 257/679 |

FOREIGN PATENT DOCUMENTS

KR 10-0521279 10/2005
KR 10-0639702 10/2006

OTHER PUBLICATIONS

Korean Office Action issued in Korean Patent Application No. 10-2008-0099316, mailed May 27, 2010.

* cited by examiner

*Primary Examiner*—S. V Clark
(74) *Attorney, Agent, or Firm*—McDermott Will & Emery LLP

(57) ABSTRACT

An electro component package is disclosed. The electro component package in accordance with an embodiment of the present invention includes a first package substrate having a first chip mounted on an upper surface thereof, the first chip having a through-via formed therein; a second package substrate being separated from the first package substrate and having a second chip mounted on an upper surface thereof; and a connection substrate having one end connected with an upper surface of the first chip and the other end connected with an upper surface of the second chip, the connection substrate electrically connecting the first chip with the second chip.

5 Claims, 4 Drawing Sheets

ELECTRO COMPONENT PACKAGE

CROSS-REFERENCE TO RELATED APPLICATIONS

This application claims the benefit of Korean Patent Application No. 10-2008-0099316, filed with the Korean Intellectual Property Office on Oct. 9, 2008, the disclosure of which is incorporated herein by reference in its entirety.

BACKGROUND

1. Technical Field

The present invention relates to an electro component package.

2. Description of the Related Art

With high-performance of digital products, the frequency of a signal transmitted and received between semiconductor devices is now becoming higher. Such a signal is transmitted through wiring formed on a substrate. Transmission quality of the signal is determined according to the characteristic of the wiring. It the transmission quality is bad, a maximum bandwidth of a signal which can be transmitted is limited.

In an electro component package according to a conventional technology, communication between a CPU chip and a memory chip is, as shown in FIG. 1, carried out through a path in the order of a bump of a CPU chip 1, wiring of a CPU package substrate 3, a solder ball, main board wiring, a solder ball, wiring of a memory package substrate 4 and a bump of a memory chip 2.

Such discontinuous points generate reflection during the transmission of a radio frequency signal and obstruct the transmission of the radio frequency signal. In order to get over the transmission obstruction caused by the reflection, a semiconductor circuit should consume more electric power.

The radio frequency signal should be regarded as a wave instead of a simple electrical signal. From the viewpoint of the transmission line of the wave, such a discontinuous environment limits transmission speed of the radio frequency signal.

While a method of locally increasing the output of a driver in a chip so as to overcome the disadvantage, a system is increasingly consuming more electric power.

An electro component package having a structure that has been improved better than that of FIG. 1 is provided in FIG. 2. The electro component package shown in FIG. 2 transmits a signal from the CPU package substrate 3 to the memory package substrate 4 by use of a substrate separated from the main board 5. However, the structure of FIG. 2 also has a limit in minimizing reflection generated during the transmission of the radio frequency signal.

SUMMARY

The present invention provides an electro component package that has an advantage in transmitting a signal between chips at a high speed, and has an ability to transmit a high bandwidth signal.

An aspect of the present invention features an electro component package. The electro component package in accordance with an embodiment of the present invention can include a first package substrate having a first chip mounted on an upper surface thereof, the first chip having a through-via formed therein; a second package substrate being separated from the first package substrate and having a second chip mounted on an upper surface thereof; and a connection substrate having one end connected with an upper surface of the first chip and the other end connected with an upper surface of the second chip, the connection substrate electrically connecting the first chip with the second chip.

A connection means can be formed on a lower surface of the one end of the connection substrate. The connection means has a protruded shape. The connection means can come in direct contact with the through-via formed in the first chip.

The first package substrate and the second package substrate can be mounted on a main board.

DETAILED DESCRIPTION

Figure 1:
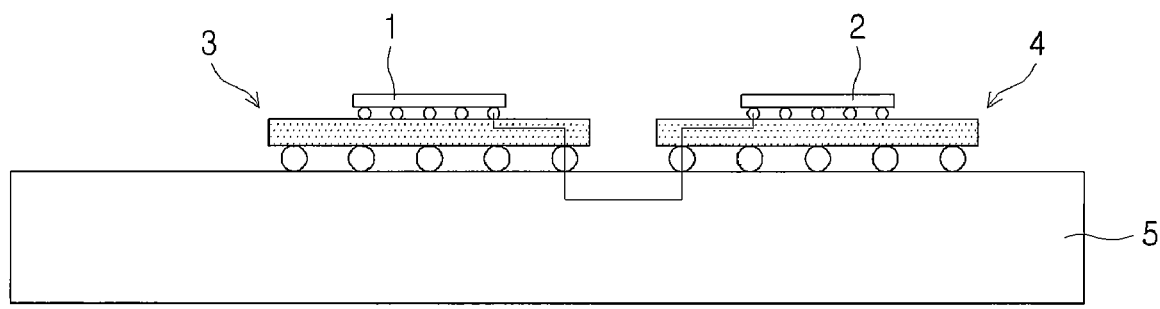
FIGS. 1 and 2 are cross sectional views showing an electro component package according to a conventional technology.
Figure 2:
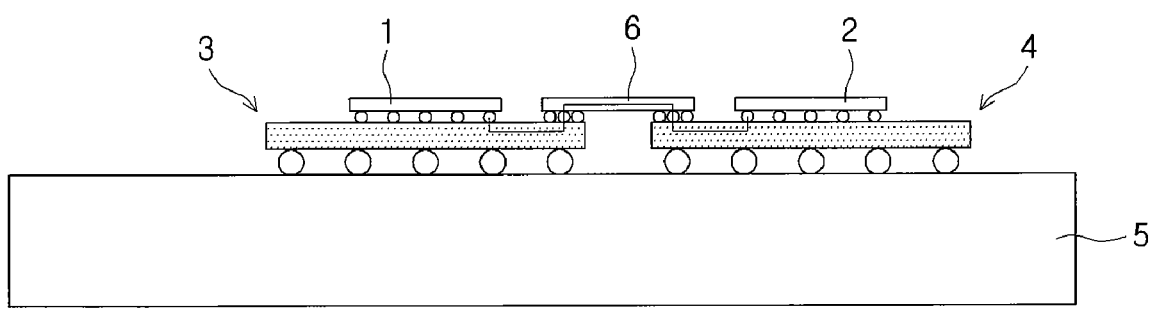

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. In the following description of the present invention, the detailed description of known technologies incorporated herein will be omitted when it may make the subject matter unclear.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, embodiments of an electro component package in accordance with the present invention will be described in detail with reference to the accompanying drawings. In description with reference to accompanying drawings, the same reference numerals will be assigned to the same or corresponding elements, and repetitive descriptions thereof will be omitted.

Figure 3:
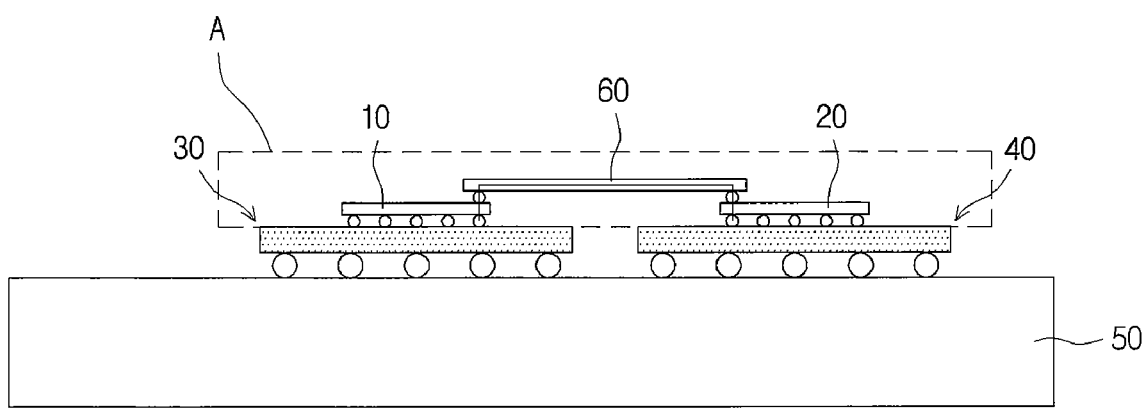
FIG. 3 is a cross sectional view showing an electro component package according to an embodiment of the present invention.
Figure 4:
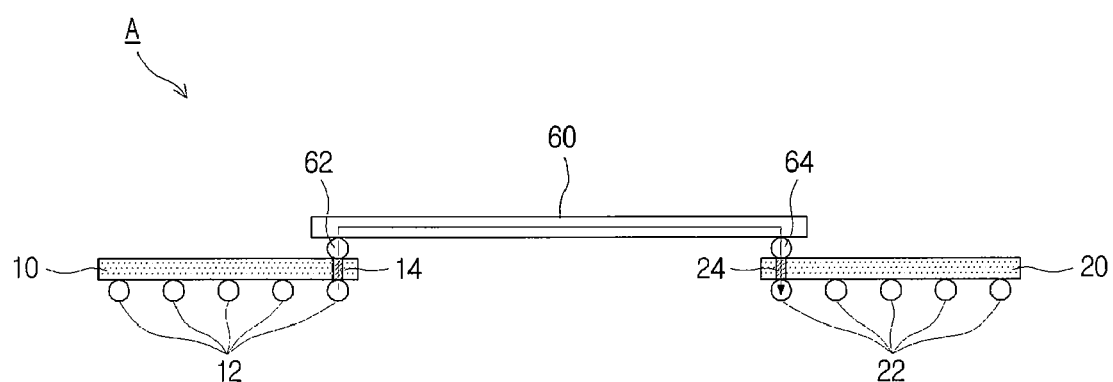
FIG. 4 is a cross sectional view showing an enlarged part denoted by "A" of FIG. 3.

FIG. 3 is a cross sectional view showing an electro component package according to an embodiment of the present invention. FIG. 4 is a cross sectional view showing an enlarged part denoted by "A" of FIG. 3. In FIGS. 3 and 4, shown are a first chip 10, a second chip 20, bumps 12 and 22, through-vias 14 and 24, a first package substrate 30, a second package substrate 40, a main board 50, a connection substrate 60, and connection means 62 and 64.

The present invention features that the electro component package utilizes a connection substrate 60 having one end connected with the upper surface of the first chip 10 and the other end connected with the upper surface of the second chip 20 in order to electrically connect the first chip 10 and the second chip 20, which are mounted on the first package substrate 30 and the second package substrate 40, respectively, which are separated from each other.

Packages having various types as well as a variety of active/passive devices (not shown) are mounted on a main board 50. Such mounted devices and packages are able to mutually transmit and receive an electrical signal through various wiring patterns (not shown). The first package substrate 30 and the second package substrate 40 to be described below are mounted separately from each other on the main board 50.

The first package substrate 30 is mounted on the main board 50. The first chip 10 like a CPU chip is mounted on the upper surface of the first package substrate 30. Not only the CPU chip but also various passive devices (not shown), a source of power for driving a CPU chip, and wiring patterns (not shown) for connecting them, etc., can be formed on the upper surface of the first package substrate 30. The first chip 10 is connected to the first package substrate 30 in a flip-chip manner through a conductive bump 12 formed on the lower surface of the first chip 10.

The second chip 20 like a memory chip is mounted on the second package substrate 40 disposed separately from the first package substrate 30 on the main board 50. Similarly to the first package substrate 30, various passive devices (not shown) and wiring patterns (not shown) are formed on the second package substrate 40. The second chip 20 is also connected to the second package substrate 40 in a flip-chip manner through a conductive bump 22 formed on the lower surface of the second chip 20.

The connection substrate 60 is seated on the upper surfaces of the first chip 10 and the second chip 20 for the purpose of electrically connecting the first chip 10 and the second chip 20, each of which is mounted on the first package substrate 30 and the second package substrate 40, respectively. That is, as shown in FIGS. 3 and 4, one end of the connection substrate 60 is seated on the upper surface of the first chip 10 and then is electrically connected with the upper surface of the first chip 10 through a connection means 62 such as a solder ball and a bump and so on. The other end of the connection substrate 60 is seated on the upper surface of the second chip 20 and then is electrically connected with the upper surface of the second chip 20 through a connection means 64.

Meanwhile, a through-via 14 is formed in the first chip 10 in order to shorten the signal transmission path between the connection substrate 60 and the first package substrate 30. In other words, as shown in FIG. 4, the signal transmission path from the connection substrate 60 located on the upper surface of the first chip 10 to the first package substrate 30 located on the lower surface of the first chip 10 can be shortened by forming the through-via 14 passing through the first chip 10 and electrically connecting the upper and lower surfaces of the first chip 10.

In this case, it is possible to minimize the signal transmission path by causing the connection means 62 such as a solder ball, a bump, etc., formed on the lower surface of the connection substrate 60 directly to contact with the through-vias 14 and 24 formed in the first chip 10.

Similarly to the first chip 10, the through-via 24 is also formed in the second chip 20. It is clear that the connection means 64 directly contacts with the through-via 24 formed in the second chip 20.

If the structure described above is applied, as shown in FIG. 4, the number of points at which a signal is refracted on the signal transmission path from the first chip 10 to the second chip 20, that is, discontinuous points, can be minimized. As a result, the structure of the present invention has an advantage to transmit a signal at a high speed.

While the present invention has been described with reference to exemplary embodiments thereof, it will be understood by those skilled in the art that various changes and modification in forms and details may be made without departing from the spirit and scope of the present invention as defined by the appended claims.

Numerous embodiments other than embodiments described above are included within the scope of the present invention.

What is claimed is:

1. An electro component package comprising:
a first package substrate having a first chip mounted on an upper surface of the first package substrate, the first chip having a through-via passing through the first chip and electrically connecting upper and lower surfaces of the first chip;
a second package substrate being separated from the first package substrate and having a second chip mounted on an upper surface thereof; and
a connection substrate having one end connected with the through-via formed in the first chip and the other end connected with an upper surface of the second chip, the connection substrate electrically connecting the first chip with the second chip.

2. The electro component package of claim 1, wherein:
a connection means being formed on a lower surface of the one end of the connection substrate, the connection means having a protruded shape; and
the connection means coming in direct contact with the through-via formed in the first chip.

3. The electro component package of claim 1, further comprising a main board having the first package substrate and the second package substrate mounted on one surface thereof.

4. The electro component package of claim 1, wherein
the second chip has a through-via passing through the second chip, and electrically connecting the upper and lower surfaces of the second chip, and
the other end of the connection substrate is connected with the through-via formed in the second chip.

5. The electro component package of claim 4, wherein
a connection means is formed on a lower surface of the other end of the connection substrate, and
the connection means is in direct contact with the through-via formed in the second chip.

* * * * *